United States Patent [19]

Abdi et al.

[11] Patent Number: 5,517,141
[45] Date of Patent: May 14, 1996

[54] DIFFERENTIAL HIGH SPEED TRACK AND HOLD AMPLIFIER

[75] Inventors: Behrooz Abdi, Gilbert; Gary Stuhlmiller, Chandler, both of Ariz.

[73] Assignee: Motorola, Inc., Schaumburg, Ill.

[21] Appl. No.: 400,686

[22] Filed: Mar. 8, 1995

Related U.S. Application Data

[63] Continuation of Ser. No. 147,266, Nov. 5, 1993, abandoned.

[51] Int. Cl.$^6$ .................................................. G11C 27/02
[52] U.S. Cl. ........................ 327/96; 327/94; 327/306; 327/91
[58] Field of Search .................................... 307/352, 353; 328/151; 330/254, 278; 327/307, 90, 91, 94, 95, 96, 306, 312, 316, 317, 103, 361

[56] References Cited

U.S. PATENT DOCUMENTS

| | | | |
|---|---|---|---|
| 4,150,310 | 4/1979 | Emile, Jr. ........................... | 328/151 |
| 4,370,572 | 1/1983 | Cosand et al. ..................... | 328/151 |
| 4,845,382 | 7/1989 | Eouzan et al. ..................... | 307/353 |
| 5,019,722 | 5/1991 | Hess et al. ......................... | 328/164 |
| 5,220,219 | 6/1993 | Barber ................................ | 327/91 |

FOREIGN PATENT DOCUMENTS

| | | | |
|---|---|---|---|
| 5-128890 | 5/1993 | Japan ................................. | 327/96 |

*Primary Examiner*—Timothy P. Callahan
*Assistant Examiner*—Dinh T. Le
*Attorney, Agent, or Firm*—Rennie W. Dover; Bradley J. Botsch, Sr.

[57] ABSTRACT

A differential track and hold amplifier circuit (200) is provided. The track and hold amplifier includes an input transconductance amplifier (212), an output amplifier (111), and a second transconductance amplifier (214). The track and hold circuit further includes a switching circuit (108) for coupling the output of the input transconductance amplifier to a capacitor (110) in the output stage of the track and hold circuit during track mode, and for decoupling the capacitor from the input amplifier during hold mode. The track and hold circuit further includes a subtractor circuit (103) for reducing a common mode voltage of the output of the input transconductance amplifier, thereby maintaining a stable voltage across the capacitor during hold mode. Further, during hold mode, the second transconductance amplifier acts in a negative feedback configuration to reduce the gain of the input amplifier to attenuate its output signal.

15 Claims, 2 Drawing Sheets

DIFFERENTIAL HIGH SPEED TRACK AND HOLD AMPLIFIER

This application is a continuation of prior application Ser. No. 08/147,266, filed Nov. 5, 1993 and now abandoned.

BACKGROUND OF THE INVENTION

This invention relates, in general, to track and hold circuits, and more particularly to track and hold amplifiers for accurate high speed operation.

A track and hold amplifier is used for receiving a signal at an input stage, which occurs at some nominal frequency, and holding that signal at an output stage until that signal is received by some other circuitry. An example of the use of a track and hold amplifier is for read recovery in hard disk drives for computers.

Briefly, during track mode, an input voltage is received by an input stage and is transferred to a capacitor which is coupled to an input of an output buffer. During hold mode, the capacitor is de-coupled from the input stage thereby holding a charged voltage across the capacitor.

At least one prior art technique for holding a voltage across a capacitor has been done by coupling the capacitor to an amplifier with unity-gain feedback to hold the voltage across the capacitor during hold mode. However, a disadvantage of this technique is that it is difficult to maintain a gain of unity in the amplifier. As a result, if the feedback gain is greater than one, then the voltage across the will capacitor will drift upward. Similarly, if the feedback gain is less than one, then the voltage across the will drift downward.

Hence there exists a need for a track and hold amplifier which can operate accurately at a high input frequency, and that can hold a received voltage accurately for an output stage.

DETAILED DESCRIPTION OF THE DRAWINGS

Generally, the present invention provides a differential high-speed track and hold amplifier. Briefly, the present invention is comprised first of an input amplifier, typically a transconductance amplifier with resistive load, a pair of high speed switches forming a switching circuit, a hold capacitor, a second transconductance amplifier and an output buffer. This circuitry works in two modes: (i) a track mode and (ii) a hold mode. During track mode operation, the switches are closed and the output signal tracks the input. During hold mode, the switches open and the output signal represents the final value of the input signal immediately before the switch opens. Furthermore, the second amplifier is enabled only during the hold mode in order to attenuate the signal at the switches, thereby minimizing feedthrough.

Figure 1:
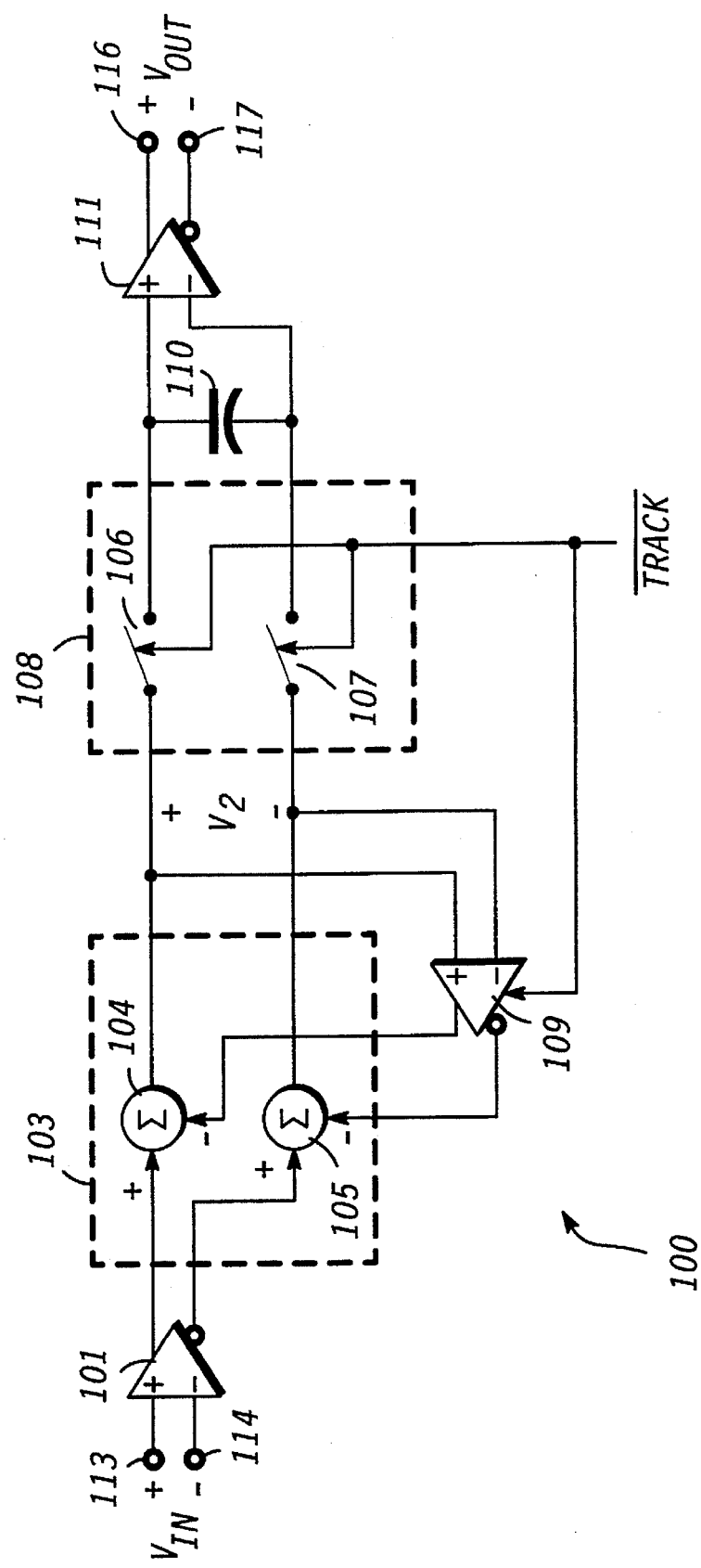
FIG. 1 shows a schematic/block diagram illustrating a track and hold amplifier in accordance with a first embodiment of the present invention.

The present invention can be more fully described with reference to FIGS. 1 and 2. FIG. 1 is a detailed schematic/block diagram illustrating differential track and hold amplifier 100. In particular, track and hold amplifier 100 includes input stage 101 having first and second inputs respectively coupled to terminals 113 and 114 at which differential input signal $V_{IN}$ is applied. The first and second outputs of input stage 101 are respectively applied to first inputs of subtractors 104 and 105 wherein subtractor 103 comprises substractors 104 and 105.

The second inputs of subtractors 104 and 105 are respectively coupled to first and second outputs of amplifier 109. Also, outputs of subtractors 104 and 105 are respectively coupled both to first and second inputs of amplifier 109 and to first and second inputs of switch circuit 108.

Switch circuit 108 includes switches 106 and 107 each having a control input coupled to receive signal $\overline{\text{TRACK}}$. Switch 106 has first and second terminals respectively coupled to the output of subtractor 104 and a first terminal of capacitor 110. Similarly, switch 107 has first and second terminals respectively coupled to the output of subtractor 105 and a second terminal of capacitor 110.

Output buffer 111 has first and second inputs respectively coupled to first and second terminals of said capacitor and has first and second outputs respectively coupled to terminals 116 and 117 for providing differential output signal $V_{OUT}$.

In operation, during track mode, the differential input signal Vin is gained/buffered through the input stage (101) and is transmitted through subtractor circuit 103 unchanged (i.e. no subtraction occurs) since amplifier 109 is rendered inoperative in this mode. Additionally, during this mode of operation, switches 106 and 107 of switching circuit 108 are closed and the signal at the output of the subtractor appears across hold capacitor 110 where it is then output through buffer 111.

During hold mode operation, signal $\overline{\text{TRACK}}$ opens switches 106 and 107 and renders operative amplifier 109. As the switches open, the signal across hold capacitor 110 is held constant at a value equal to the signal level appearing at the output of subtractor 103 immediately before the switch opens. Furthermore, the signal at the output of the subtractor is attenuated by a factor equal to the gain of the amplifier 109. A purpose of amplifier 109, whose gain is ideally equal to infinity, is to reduce the signal level at switching circuit 108 by as much as possible in order to minimize any resistive or capacitive feedthrough the switches which might otherwise occur due to parasitics. More particularly, and by way of example, the inputs of amplifier 109 are coupled to switches 106 and 107 and the outputs of amplifier 109 are coupled to input stage 101 via subtractor circuit 103. When amplifier 109 is enabled by signal $\overline{\text{TRACK}}$, i.e., when signal $\overline{\text{TRACK}}$ serves as a control signal for amplifier 109, a portion of the signal gained/buffered through input stage 101 appears at the inputs of amplifier 109. The portion of the signal appearing at the inputs of amplifier 109 is substantially equal to the signal gained/buffered through input stage 101 less the output signal of amplifier 109.

Figure 2:
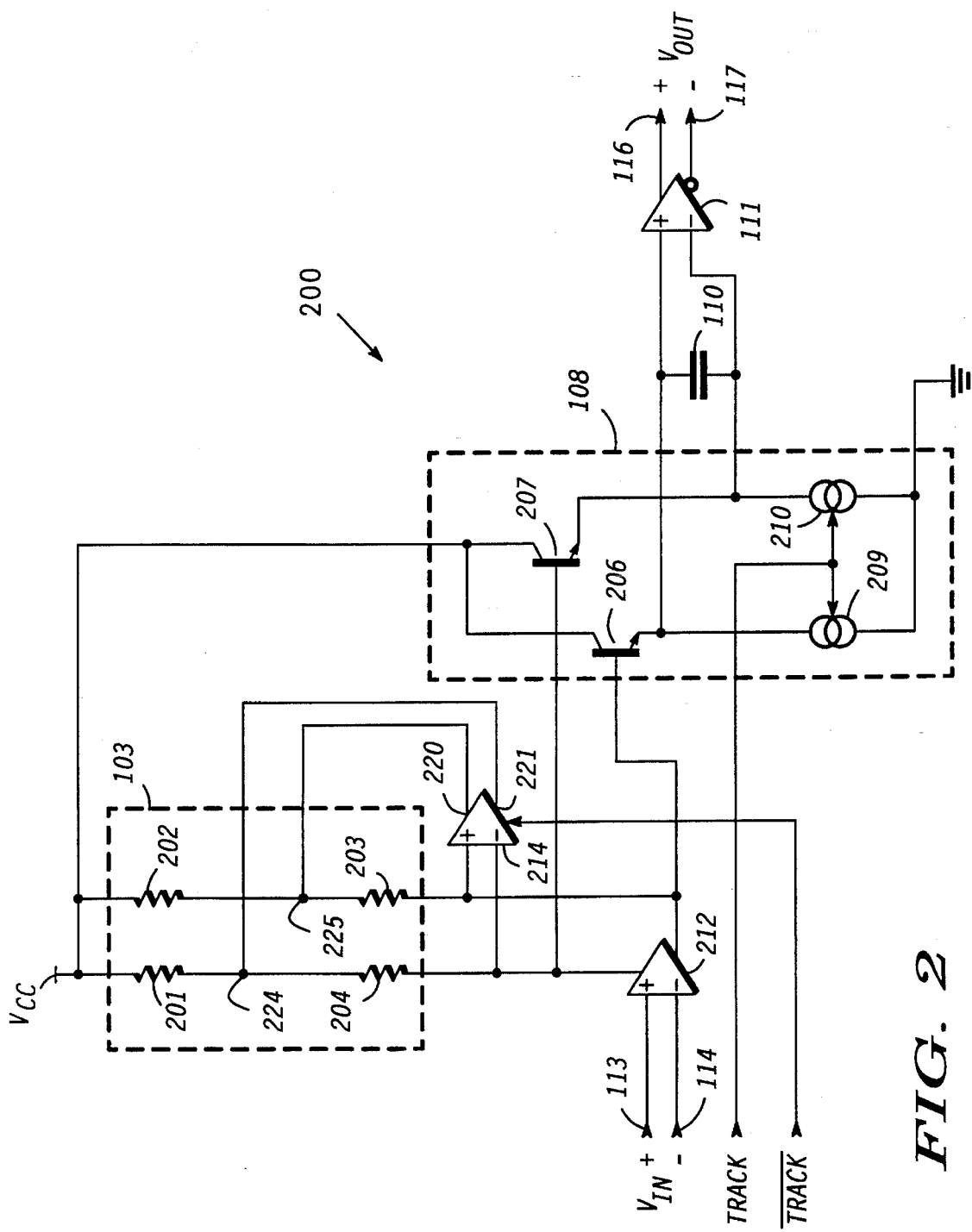
FIG. 2 shows a detailed schematic/block diagram illustrating a track and hold circuit in accordance with a second embodiment of the present invention.

Referring to FIG. 2, there is illustrated a detailed schematic/block diagram of track and hold circuit 200. It is understood that components shown in FIG. 2 that are similar to components shown in FIG. 1 are identified by the same reference numbers. Track and hold circuit 200 includes a transconductance amplifier 212 having first and second inputs coupled to terminals 113 and 114, respectively.

The circuit shown in FIG. 2 includes resistor 204 coupled between the second output of transconductance amplifier 214 and the first output of transconductance amplifier 212. Similarly, resistor 205 is coupled between the first output of transconductance amplifier 214 and the second output of transconductance amplifier 212. In addition, the first output of transconductance amplifier 212 is coupled to a first input of transconductance amplifier 214 and the second output of transconductance amplifier 212 is coupled to a second input of transconductance amplifier 214. A a resistor 201 is coupled between a first supply voltage terminal at which an operating potential of $V_{CC}$ is applied and the second output 220 of transconductance amplifier 214. Similarly, resistor 202 is coupled between the first supply voltage terminal and the first output 221 of transconductance amplifier 214. Resistors 201 and 204 are analogous to subtractor 104 and resistors 202 and 205 are analogous to subtractor 105; therefore, resistors 201, 204, 202, and 205 are analogous to subtractor circuit 103.

Switching circuit 108 includes transistor 206 having a collector coupled to the first supply voltage terminal and a base coupled to the second output of transconductance amplifier 212. The emitter of transistor 206 is coupled through switched current source 209 and returned to ground. The emitter of transistor 206 is also coupled to the first terminal of capacitor 110. Transistor 207 has a collector coupled to the first supply voltage terminal and a base coupled to the first output of transconductance amplifier 212. The emitter of transistor 207 is coupled through switched current source 210 and returned to ground. Also, the emitter of transistor 207 is coupled to the second terminal of capacitor 110.

In operation, transconductance amplifier 212 translates the input differential voltage appearing across terminals 113 and 114 to a differential current flowing through series resistors 201/204 and 202/205. During track mode control signal TRACK turns on current sources 209 and 210. Further, control signal $\overline{\text{TRACK}}$ is disabled, and renders transconductance amplifier 214 non-operative. The voltage developed at the output of amplifier 212 is buffered through transistors 206 and 207 and appears across hold capacitor 110 before being output through buffer 111.

During hold mode control signal TRACK is disabled which turns off current sources 209 and 210. Amplifier 214, which is rendered operative in this mode, translates the input voltage of amplifier 212 into a differential current to be subtracted from the differential current provided at the outputs of amplifier 212. This action has two effects on the operation. First, the subtraction of the two differential currents from amplifiers 212 and 214 at the resistor summing nodes, via resistors 201 and 202 reduces the differential voltage at the output of amplifier 212 and input to the bases of transistors 206 and 207. Second, the common mode current from transconductance amplifier 214 is added to that of amplifier 212 in order to reduce the common mode voltage at the bases of transistors 206 and 207. The reduction of this common mode voltage together with turning off current sources 209 and 210 translates devices 206 and 207 into the cutoff region, while the reduction of the differential voltage at the input to their bases reduces any parasitic coupling from the output of amplifier 212 to hold capacitor 110. Transistors 206 and 207 along with current sources 209 and 210 make up the switching circuit 108.

The present invention provides a circuit and method for tracking and holding input signals. With such a circuit and method, it is feasible to sample high speed analog signals with minimal or no feedthrough to the output. With large amplitude input signals it is very difficult to maintain the switching transistors in the cutoff region. The present invention reduces differential signal amplitude drastically at the input to the switches thus eliminating signal feedthrough.

While the invention has been described in specific embodiments thereof, it is evident that many alterations, modifications and variations will be apparent to those skilled in the art. Accordingly, it is intended to embrace such alterations, modifications, and variations in the appended claims.

We claim:

1. A differential track and hold amplifier responsive to an input signal for providing an output signal, comprising:

an input stage coupled for receiving the input signal and for providing a first signal;

a capacitor;

switching means coupled between said input stage and said capacitor, said switching means responsive to a control signal for transferring said first signal for use in storing a voltage across said capacitor;

an output stage coupled to said capacitor, said output stage responsive to said voltage appearing across said capacitor for providing the output signal;

a substrator circuit coupled between said input stage and said switching means, the substractor circuit responsive to said control signal for reducing a gain of said input stage; and an amplifier responsive to said control signal and having an amplifier input coupled to an input of said switching means, said amplifier having at least one output coupled to said substractor circuit for providing a second signal and wherein said substractor circuit is coupled to said input stage and to the at least one output of said amplifier for providing a portion of said first signal to the input of the amplifier, the portion of said first signal being substantially equal to the difference between said first signal and said second signal.

2. The differential track and hold amplifier according to claim 1, wherein said substractor circuit comprises:

a first resistor having first and second terminals and a second resistor having first and second terminals, the first terminal of the first resistor coupled to the first terminal of the second resistor and to a first power supply; and third and fourth resistors each having first and second terminals, wherein the first terminal of the third resistor is coupled to the second terminal of the first resistor and the second terminal of the third resistor is coupled to the first output terminal of the amplifier and the first terminal of the fourth resistor is coupled to the second terminal of the second resistor and the second terminal of the fourth resistor is coupled to a second output terminal of the amplifier.

3. A differential track and hold amplifier, comprising:

a first transconductance amplifier responsive to an input signal and having first and second outputs;

a second transconductance amplifier responsive to a control signal for rendering said second transconductance amplifier operative and having first and second inputs and first and second outputs, said first and second inputs of said second transconductance amplifier respectively coupled to said first and second outputs of said first transconductance amplifier;

a resistance circuit coupled between said first and second outputs of said second transconductance amplifier and said first and second outputs of said first transconductance amplifier;

a subtractor circuit coupled between a first supply voltage terminal and said first and second outputs of said transconductance amplifier;

a capacitor;

a switching circuit responsive to said control signal and having first and second inputs respectively coupled to said first and second outputs of said first transconductance amplifier, said switching circuit for transferring signals appearing at said first and second outputs of said first transconductance stage for use in storing a voltage across said capacitor;

an output stage responsive to said voltage appearing across said capacitor for providing an output signal; and wherein a common mode voltage of signals appearing at first and second inputs of said switching circuit is reduced when said second transconductance amplifier is rendered operative.

4. The track and hold amplifier according to claim 3 wherein said subtractor circuit includes:

a first resistor coupled between said first supply voltage terminal and said first output of said second transconductance amplifier; and a second resistor coupled between said first supply voltage terminal and said second output of said second transconductance amplifier.

5. The track and hold amplifier according to claim 3 wherein said switching circuit includes:

a first transistor having a collector, a base and an emitter, said collector of said first transistor coupled to said first supply voltage terminal, said base of said first transistor coupled to said first output of said first transconductance amplifier, said emitter of said first transistor being coupled to a first terminal of said capacitor;

a second transistor having a collector, a base and an emitter, said collector of said second transistor coupled to said first supply voltage terminal, said base of said second transistor coupled to said second output of said first transconductance amplifier, said emitter of said second transistor being coupled to a second terminal of said capacitor; and current source means coupled to said emitters of said first and second transistors and being responsive to said control signal for supplying current thereat.

6. The differential track and hold amplifier according to claim 1, wherein said input stage comprises a transconductance amplifier.

7. The differential track and hold amplifier according to claim 1, wherein said amplifier responsive to said control signal comprises a transconductance amplifier.

8. The differential track and hold amplifier according to claim 1, wherein said amplifier responsive to said control signal comprises first and second input terminals and first and second output terminals, and said substractor circuit comprises a first substractor means having first and second input terminals and an output terminal and a second substractor means having first and second input terminals and an output terminals, the first input terminal of the amplifier responsive to said control signal coupled to the output terminal of the substractor means, the second input terminal of the amplifier responsive to said control signal coupled to the output terminal of the second substractor means, the first output terminal of the amplifier responsive to said control signal coupled to the first input terminal of the first substractor means, the second input terminal of the first substractor means coupled to the input stage and the second output terminal of the amplifier responsive to said control signal coupled to the first input terminal of the second substractor means, the second input terminal of the second substractor means coupled to the input stage.

9. The differential track and hold amplifier according to claim 4, wherein the subtractor circuit further includes:

a third resistor coupled between said first output of said second transconductance amplifier and said first output of said first transconductance amplifier; and a fourth resistor coupled between said second output of said second transconductance amplifier and said second output of said first transconductance amplifier.

10. The differential track and hold amplifier amplifier according to claim 9, wherein said switching circuit includes:

a first transistor having a collector, a base and an emitter, said collector of said first transistor coupled to said first supply voltage terminal, said base of said first transistor coupled to said first output of said first transconductance amplifier, said emitter of said first transistor being coupled to a first terminal of said capacitor;

a second transistor having a collector, a base and an emitter, said collector of said second transistor coupled to said first supply voltage terminal, said base of said second transistor coupled to said second output of said first transconductance amplifier, said emitter of said second transistor being coupled to a second terminal of said capacitor; and current source means coupled to said emitters of said first and second transistors and being responsive to said control signal for supplying current thereat.

11. A method for tracking and holding an input signal of a track and hold circuit, the method comprising the steps of:

receiving the input signal;

converting the input signal into a first differential current signal;

operating in a tracking mode by;

closing a switching circuit;

disabling a substraction function of a substractor circuit;

converting the first differential current signal into a differential voltage signal using the substractor circuit, the differential voltage signal appearing at an input of the switching circuit; and charging a capacitor with said differential voltage signal;

operating in a holding made by;

opening the switching circuit to store said voltage appearing across said capacitor, wherein the voltage appearing across said capacitor is transmitted to an output of the track and hold circuit;

converting said differential voltage signal into a second differential current signal using an amplifier; and enabling the substraction function of the substractor circuit to substract the second differential current signal from the first differential current signal and provide the difference to the input of the switching circuit.

12. The method of claim 11, wherein the step of converting the differential voltage signal into a second differential current signal when operating in said second mode includes enabling a transconductance amplifier.

13. A method for tracking and holding an input signal of a track and hold circuit, the method comprising the steps of:

receiving the input signal;

converting the input signal into a first differential current signal;

operating in a tracking mode by;

closing a switching circuit;

disabling a substraction function of a substractor circuit coupled to said switching circuit;

converting the first diferential current signal into a differential voltage signal using the substractor circuit, the differential voltage signal appearing at an input of a switching circuit; and charging a capacitor with said differential voltage;

operating in a holding mode by;

opening the switching circuit to store said differential voltage signal across said capacitor by turning off a set of current sources and turning off a set of transistors, wherein a first transistor of said set of transistors is coupled to a first terminal of said capacitor and a second transistor of said set of transistors is coupled to a second terminal of the capacitor, wherein the voltage appearing across said capacitor is transmitted to an output of the track and hold circuit;

converting said differential voltage signal into a second differential current signal using a transconductance amplifier; and enabling the substractor function of the substractor circuit to substract the second differential current signal from the first differential current signal and provide the difference to the input of the switching circuit.

14. The method of claim 13, wherein the step of enabling the substractor function of the substractor circuit includes lowering a common mode voltage appearing at a first current control electrode of said first transistor and at a second current control electrode of said second transistor.

15. The method of claim 13, wherein the step of enabling the substractor circuit when operating in the holding mode includes enabling said transconductance amplifier.

* * * * *

UNITED STATES PATENT AND TRADEMARK OFFICE
CERTIFICATE OF CORRECTION

PATENT NO. : 5,517,141
DATED : May 14, 1996
INVENTOR(S) : Behrooz Abdi and Gary Stuhlmiller It is certified that error appears in the above-indentified patent and that said Letters Patent is hereby corrected as shown below:

Claim 1, column 4, line 18, replace "substrator" with --subtractor--.

Claim 1, column 4, lines 19, 25, 26, replace "substractor" with --subtractor--.

Claim 2, column 4, line 33, replace "substractor" with --subtractor--.

Claim 8, column 5, lines 50, 51, 52/53, 56, 58, 60/61, 61/62, 65, 66, replace "substractor" with --subtractor--.

Claim 8, column 5, line 54, replace "terminals" with --terminal--.

Claim 10, column 6, line 9, delete "amplifier", second occurrence.

Claim 11, column 6, lines 35, 48, replace "substraction" with --subtraction--.

Claim 11, column 6, lines 35, 37, 48, replace "substractor" with --subtractor--.

Claim 11, column 6, line 49, replace "substract" with --subtract--.

Claim 13, column 6, line 63, replace "substraction" with --subtraction--.

Claim 13, column 7, line 2, replace "substractor" with --subtractor--.

Claim 13, column 8, line 4, replace both occurrences of "substractor" with --subtractor--.

UNITED STATES PATENT AND TRADEMARK OFFICE
CERTIFICATE OF CORRECTION

PATENT NO. : 5,517,141
DATED : May 14, 1996
INVENTOR(S) : Behrooz Abdi and Gary Stuhlmiller It is certified that error appears in the above-indentified patent and that said Letters Patent is hereby corrected as shown below:

Claim 13, column 8, line 5, replace "substract" with --subtract--.

Signed and Sealed this

Seventh Day of October, 1997

BRUCE LEHMAN

*Attest:*

*Attesting Officer*          Commissioner of Patents and Trademarks